United States Patent [19]
Mitarai

[11] 3,995,222
[45] Nov. 30, 1976

[54] SINUSOIDAL WAVEFORM GENERATOR
[75] Inventor: Akira Mitarai, Yamatokoriyama, Japan
[73] Assignee: Sharp Kabushiki Kaisha, Osaka, Japan
[22] Filed: Nov. 19, 1975
[21] Appl. No.: 633,451

[30] Foreign Application Priority Data
Nov. 19, 1974   Japan.............................. 49-133360

[52] U.S. Cl.................................. 328/27; 328/13; 307/216; 307/261
[51] Int. Cl.²......................... H03B 1/00; H03K 5/00
[58] Field of Search ................. 328/13, 27; 307/260, 307/261, 268, 269

[56] References Cited
UNITED STATES PATENTS
3,223,925   12/1965   Florac, Jr.............................. 328/27
3,649,923   3/1972   Venturini............................ 307/261
3,863,158   1/1975   Kupersmith et al. ................ 328/27

*Primary Examiner*—Stanley D. Miller, Jr.
*Assistant Examiner*—B. P. Davis
*Attorney, Agent, or Firm*—Birch, Stewart, Kolasch & Birch

[57] ABSTRACT

In obtaining a sinusoidal waveform signal of a predetermined frequency, a rectangular waveform signal having a frequency four times higher than the pedetermined frequency of the sinusoidal waveform signal is provided and then subjected to frequency divisions of ½ and ¼ through the use of a couple of binary counters. While the original rectangular waveform signal and the ½ frequency divided rectangular waveform signal are both passed through an EXCLUSIVE OR circuit, the ½ frequency divided and ¼ frequency divided rectangular waveform signals are passed through another EXCLUSIVE OR circuit. Both of the outputs of the EXCLUSIVE OR circuits are added to develop a desired step waveform signal, after being evaluated at different weights. The generation of the predetermined sinusoidal waveform signal is achieved by filtering the thus obtained step waveform signal.

8 Claims, 5 Drawing Figures

SINUSOIDAL WAVEFORM GENERATOR

BACKGROUND OF THE INVENTION

The present invention generally relates to a sinusoidal waveform generator.

One way to obtain a sinusoidal waveform signal of a specific frequency is to directly generate the sinusoidal waveform signal. An alternative way is to obtain the same from a frequency standard through the use of frequency division techniques and other conventional techniques.

In the former method, sinusoidal waveform signals of accurate frequency are obtainable by utilization of crystal resonators, mechanical resonators, etc. However, in particular ranges of frequency, no proper elements such as crystal resonators are found.

In the latter case where the desired sinusoidal waveform signal is to be obtained from the frequency standard through the use of the frequency division technique, the sinusoidal waveform signal in any range of frequency may be obtained easily with the aid of recent developments in digital integrated circuits. Because the waveform is rectangular, it is difficult to alleviate any harmonic wave distortion through a simple filter. Therefore, when it is desired to utilize the thus obtained signal as the sinusoidal waveform signal, a variety of difficulties are encountered.

Accordingly, it is an object of the present invention to provide a sinusoidal waveform signal generator which is able to provide sinusoidal waveform signals in any desired range of frequency with a substantial reduction in the harmonic wave distortion therein.

In order to achieve the above described object, pursuant to the concept of the present invention, a rectangular waveform signal is first provided at a frequency four times higher than the frequency of a desired sinusoidal waveform signal to be generated, and thereafter frequency-divided by two and four through the use of a couple of binary counters. Subsequent to this, a predetermined step waveform signal is provided via two resistors and an adder in accordance with the states of the respective counters. The harmonic wave components thereof are removed via a filter.

BRIEF DESCRIPTION OF THE DRAWINGS

Other objects and many of the attendant advantages of the present invention will be readily appreciated as the same becomes better understood by reference to the following detailed description which is considered in conjunction with the accompanying drawings in which like reference numerals designate like parts throughout the figures, and wherein.

DETAILED DESCRIPTION OF THE INVENTION

The operating principle of the present invention will be given below with the aid of FIGS. 1 and 2.

Figure 1:
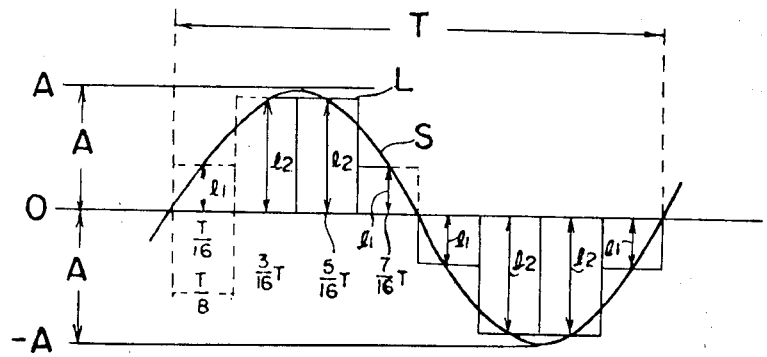
FIGS. 1 and 2 are timing diagrams for the purpose of explanation of the operating principle of the present invention.

In FIG. 1, S represents a typical sinusoidal waveform signal of which the duration is designated T and the peak value is designated A. The sinusoidal waveform S approximates a step waveform graduated at T/8 as illustrated by L in FIG. 1.

The respective values $l_1$ and $l_2$ of the sinusoidal waveform S at T/16, 5/16T and 3/16T, 7/16T can be expressed below.

$$\left. \begin{array}{l} l_1 = A \sin \dfrac{T}{16} \times \dfrac{2\pi}{T} = A \sin \dfrac{\pi}{8} \\ l_2 = A \sin \dfrac{3}{16} \times \dfrac{2\pi}{T} = A \sin \dfrac{3}{8}\pi \end{array} \right\} \quad (1)$$

The above formula (1) can be rewritten as follows.

$$l_2/l_1 = 1 + \sqrt{2} \qquad (2)$$

Figure 2:
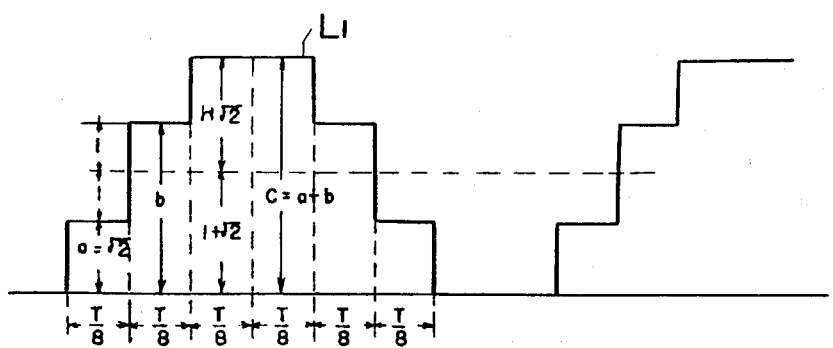

If the existence of direct current components is permissible, then the step waveform L of FIG. 1 will have substantially the same alternating current component as that of the step waveform $L_1$ of FIG. 2. The following relationship is viewed from FIG. 2.

$$\left. \begin{array}{l} a = \sqrt{2} \\ b = 2 + \sqrt{2} \\ c = a + b = 2 + \sqrt{2} \end{array} \right\} \quad (3)$$

The fundamental waveform component occupies around 97% of the total of these alternating current component energies of the step waveform, while the harmonic wave components occupy the remaining percentage. Particularly, the even items of these harmonic wave components are zero and the odd items, that is, the third and fifth harmonic wave components are zero. The generation of a desired sinusoidal waveform signal having no harmonic wave distortion is therefore accomplished by generating the step waveform signal as suggested by $L_1$ in FIG. 1 and then removing the seventh and higher harmonic wave components therefrom.

The detailed description of constructional and operational features of one of the preferred embodiments constructed in accordance with the principal concept of the present invention set forth briefly above will be given by reference to FIGS. 3 and 4.

Figure 3:
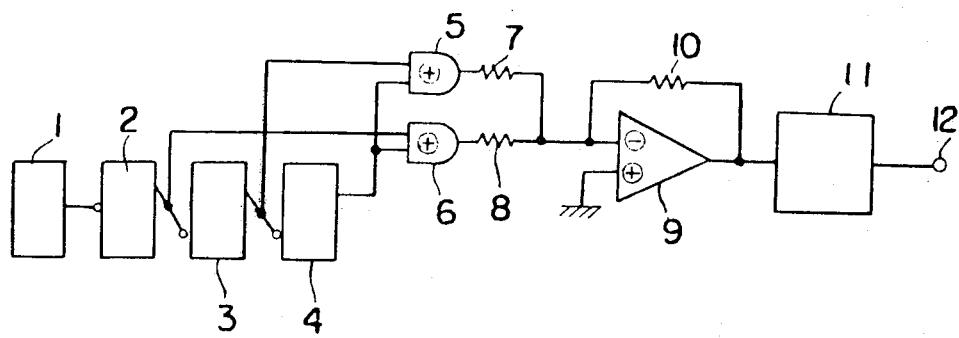
FIG. 3 is a schematic block diagram illustrating one preferred form of the present invention.

In FIG. 3, there is illustrated a schematic block diagram of a sinusoidal waveform generator arrangement, which includes a clock pulse generator 1, three binary counters 2, 3, 4, a couple of EXCLUSIVE OR circuits 5, 6, resistors 7, 8, an operational amplifier 9, a feedback resistor 10 and a band-pass filter 11. The generator 1 provides a train of clock pulses with frequency eight times higher than the frequency of a desired sinusoidal waveform signal for the binary counter 2 at the first stage. While the second counter 3 receives the output of the counter 2, the last counter 4 receives the counterpart of the counter 3. The inputs to the EXCLUSIVE OR circuit 5 are the outputs of the counters 3, 4 and the inputs to the other EXCLUSIVE OR circuit 6 are the outputs of the counters 2, 4. The operational amplifier 9 at its ⊖ input receives the outputs of the EXCLUSIVE OR circuits 5, 6 via the respective resistors 7, 8, the ⊕ input of the operational amplifier 9 being grounded. The filter 11 receives as its input the output of the operational amplifier 9 to thereby remove the direct current component and the seventh harmonic wave component therefrom. The output of the filter 11 is derived from a terminal 12. The resistance values $R_1$, $R_2$ of the respective resistors 7, 8 are chosen as follows.

$$R_1/R_2 = 1/1 + \sqrt{2}$$

With such a circuit arrangement, the clock pulses from the generator 1 as viewed from FIG. 4(A) are impressed on the binary counter 2 so that the rectangular waveform signal shown in FIG. 4(B) is derived from the counter 2. As noted earlier, the frequency of the clock pulses (A) is eight times higher than the frequency of the desired sinusoidal waveform signal to be obtained, while the frequency of the rectangular waveform signal (B) derived via the binary counter 2 is four times higher than the sinusoidal signal frequency. In other words, the clock pulse generator 1 and the binary counter 2 in combination form the rectangular waveform signal at a frequency four times higher than the desired sinusoidal signal frequency. Application of the rectangular signal (B) to the binary counter (frequency divider) allows the binary counter 3 to provide the rectangular waveform signal viewed from FIG. 4(C) therefrom. It will be noted that the frequency of the thus obtained rectangular signal is twice higher than that of the desired sinusoidal signal. The rectangular signal (C) is applied to the binary counter (frequency divider) 3, which, in turn, provides the rectangular waveform signal shown in FIG. 4(D). The frequency of the rectangular signal (D) is identical with that of the desired sinusoidal signal. That is to say, the binary counter 3 serves to divide the frequency of the rectangular signal (B) by two while the binary counter 4 serves to divide the same by four. Both of the rectangular signals (C) and (D) are inputs to the EXCLUSIVE OR circuit 5 of which the output is illustrated in FIG. 4(E). The other EXCLUSIVE OR circuit 6 receives the rectangular signals (B) and (D) and, accordingly, provides the output viewed from FIG. 4(F). The reference numbers given on the right of FIGS. 4(B) through 4(G) correspond to the respective elements 2, 3, 4, 5, 6, 9.

The rectangular signals (E) and (F) are weighed at different magnifying powers via the resistors 7, 8 and then added together via the operational amplifier or adder 9. Since, as set forth previously, the resistance values $R_1$ and $R_2$ of the resistors 7 and 8 are correlated as $1 : 1 + \sqrt{2}$, the rectangular waveform signal (E) outputted via the EXCLUSIVE OR circuit 5 and the counterpart (F) outputted via the EXCLUSIVE OR circuit 6 are weighed at a ratio of $1 : 1 + \sqrt{2}$ by means of the resistors 7, 8. The output (G) of the operational amplifier 9 can be expressed by the following formula:

$$\frac{R_1 - R_2}{R_3} V$$

wherein $V$ is the peak value of the rectangular signals (E) and (F) and $R_3$ is the resistance of the feed-back resistor 10.

Provided that the peak valve of the output (G) during the durations of period from $t_1$ to $t_2$ where the rectangular waveform (F) occurs is equal to $a$ in FIG. 2, the peak value during the durations from $t_2$ to $t_3$ where the rectangular waveform (E) occurs will be $a \times (1 + \sqrt{2})$ and therefore $b$ in FIG. 2. The peak value of the output (G) during the period from $t_3$ to $t_5$ where both of the rectangular signals (E) and (F) occur will be identical with c in FIG. 2 because of $a + a(1 + \sqrt{2}) = a + b$. As noted earlier, the pulse interval of the clock pulses (A) and, in other words, the respective period from $t_1$ to $t_2$, from $t_2$ to $t_3$, from $t_3$ to $t_4$ and from $t_4$ to $t_5$ is T/8. The output (G) is therefore the equivalency to the step waveform signal $L_1$ shown in FIG. 2. As discussed with reference to FIG. 2, within the harmonic components of the step waveform $L_1$, the even items are zero and also the third and fifth harmonic wave components of the odd items are zero. The fundamental wave component occupies around 97% in the total of energy of the alternating current component. Removal of the direct current component and the seventh and higher harmonic wave components included within the step waveform (G) via the band-pass filter 11 results in the provision of the desired sinusoidal waveform signal shown in FIG. 4(G) of which the cycle is designated T.

Although in the given example, the clock pulse generator 1 having the oscillation frequency eight times higher than that of the desired sinusoidal waveform signal is utilized together with the binary counter 2 in order to obtain the rectangular waveform signal with a frequency four times higher than the sinusoidal signal frequency, it is obvious that utilization of clock pulses having a duty ratio of 1 : 1 and a frequency four times higher than the desired sinusoidal signal frequency may be the substitute for the rectangular waveform signal viewed from FIG. 4(B). Supply of bias voltage to the ⊖ input terminal of the operational amplifier 9 may eliminate the direct current component of the step waveform signal (G).

Meantime, in case of digital FM modems of 1200 BPS, for example, it is required to oscillate sinusoidal waveforms of 1300 Hz and 2100 Hz in accordance with the inputs. However, it is not desirable in order to achieve successive switching between 1300 Hz and 2100 Hz that both of the sinusoidal waveforms of 1300 Hz and 2100 Hz are switched in response to the inputs. Therefore, this implies that the switching should be necessarily effected at the stage of eight times higher frequency. In this instance it is difficult to change such a rectangular waveform into the sinusoidal waveform by passing through a filter. This is due to the fact that the filtering of the signals of more than 2100 Hz frequencies can not be expected even by filters having sharp filtering characteristics because of a further requirement to achieve information transmission of the inputs in a frequency band other than 1300 Hz and 2100 Hz. In particular, the 1300 Hz signal may include many distortions. Application of the present invention to such modems can overcome the above-mentioned shortcoming with the aid of a simplified filter arrangement.

Figure 4:
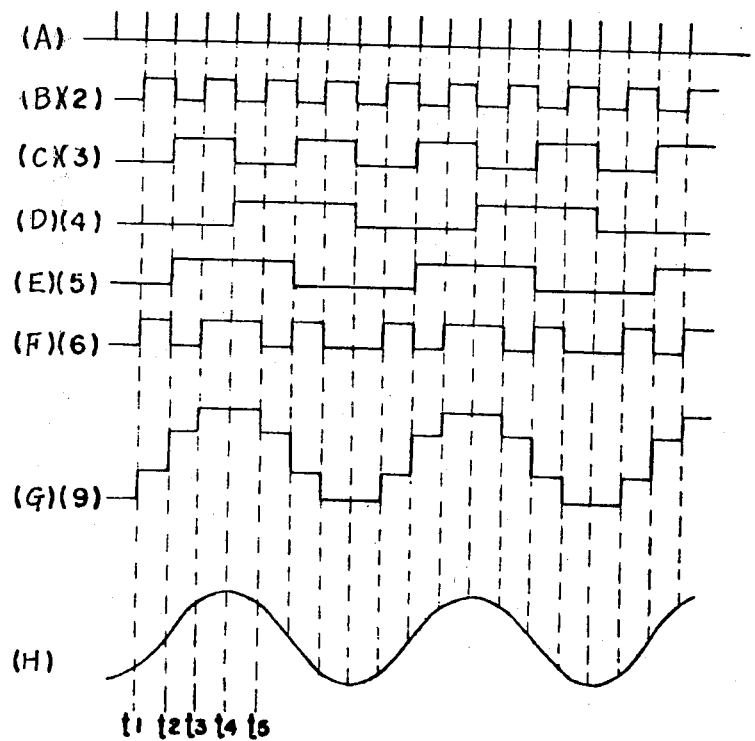
FIG. 4 is a timing diagram illustrating various signals occurring at the portions of the generator of FIG. 3.
Figure 5:
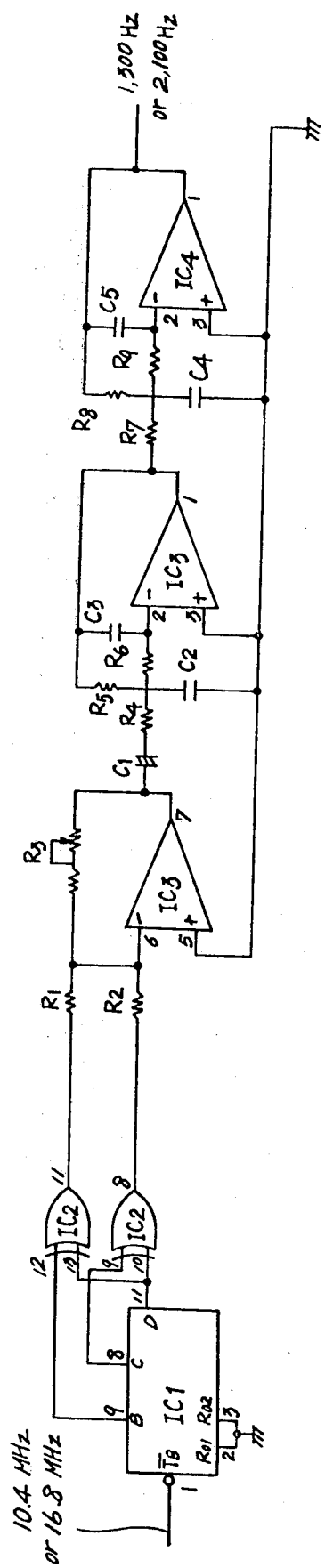
FIG. 5 is a logic diagram illustrating a rectangular-sinusoidal waveform converter embodying the present invention for use in a digital modem.

FIG. 4 illustrates implementations of the rectangular-sinusoidal waveform converting functions in accordance with the present invention. It contains integrated circuits $IC_1 - IC_4$, resistors $R_1 - R_9$ and capacitors $C_1 - C_5$ as follows.

$IC_1$ — SN 7493 (5 bit binary counter) manufactured by T1

$IC_2$ — SN 7486 (quadruple 2-input exclusive-OR gate) manufactured by T1

$IC_3$ and $IC_4$ — SN 72558 (operational amplifier) manufactured by T1

$R_1$ — 24 KΩ

$R_2$ — 10 KΩ
$R_3$ — 56 KΩ + 5 KΩ (variable)
$R_4$ — 30.9 KΩ
$R_5$ — 22.1 KΩ
$R_6$ — 12.7 KΩ
$R_7$ — 5.23 KΩ
$R_8$ — 7.68 KΩ
$R_9$ — 3.09 KΩ
$C_1$ — 2.2 μF
$C_2$ — 0.01 μF
$C_3$ — 3300 pF
$C_4$ — 0.1 μF
$C_5$ — 1500 pF In the given example, a crystal oscillator having the frequency of 3.579545 MHz is employed along with suitable frequency divider and switching arrangements.

While only certain embodiments of the present invention have been described, it will be apparent to those skilled in the art that various changes and modifications may be made therein without departing from the spirit and scope of the invention as claimed.

What is claimed is:

1. A sinusoidal waveform generator comprising:
a source of rectangular reference pulses of which the frequency is an integer multiple of the frequency of a sinusoidal waveform signal to be generated;
means for frequency dividing the rectangular reference pulses by 2;
means for frequency dividing the rectangular reference pulses by 4;
an EXCLUSIVE OR gate responsive to both of the reference pulses and the ½ frequency divided pulses;
an EXCLUSIVE OR gate responsive to both of the ½ frequency divided pulses and the ¼ frequency divided pulses;
means for effecting addition of both outputs of the EXCLUSIVE OR gates after both are weighed at different magnifying factors to thereby provide a desired step waveform signal; and
means for filtering the step waveform signal thereby providing the sinusoidal waveform signal.

2. A sinusoidal waveform generator as defined in claim 1 wherein the frequency of the rectangular reference pulses is four times higher than the predetermined frequency of the sinusoidal waveform signal.

3. A sinusoidal waveform generator as defined in claim 1 further comprising a ½ frequency divider for frequency dividing the rectangular reference pulses of which the frequency is eight times higher than the frequency of the sinusoidal waveform signal.

4. A sinusoidal waveform generator as defined in claim 1 wherein the respective frequency dividing means includes a binary counter.

5. A sinusoidal waveform generator as defined in claim 4 wherein the binary counter is implemented with integrated circuit technology.

6. A sinusoidal waveform generator as defined in claim 1 wherein the weighing means includes a couple of resistors operatively associated with the EXCLUSIVE OR gates, the resistance values of the respective resistors being chosen as $1 : 1 + \sqrt{2}$.

7. A sinusoidal waveform generator as defined in claim 1 wherein the adding means includes an operational amplifier implemented with integrated circuit technology.

8. A sinusoidal waveform generator as defined in claim 1 wherein the filtering means serves to remove the seventh and higher harmonic components included within the step waveform signal.

\* \* \* \* \*